(12) United States Patent
Nölscher et al.

(10) Patent No.: US 7,443,484 B2
(45) Date of Patent: Oct. 28, 2008

(54) METHOD FOR EXPOSING A SEMICONDUCTOR WAFER BY APPLYING PERIODIC MOVEMENT TO A COMPONENT

(75) Inventors: Christoph Nölscher, Dresden (DE); Joerg Tschischgale, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/128,431

(22) Filed: May 13, 2005

(65) Prior Publication Data

US 2006/0256314 A1 Nov. 16, 2006

(51) Int. Cl.
*G03B 27/52* (2006.01)
(52) U.S. Cl. .............................. 355/55; 355/52; 355/53
(58) Field of Classification Search .................. 355/52, 355/53, 55, 69, 67; 430/311; 356/400, 401; 250/548

See application file for complete search history.

(56) References Cited

U.S. PATENT DOCUMENTS

| | | | | |
|---|---|---|---|---|
| 5,476,736 A | * | 12/1995 | Tanabe | 355/67 |
| 5,610,684 A | * | 3/1997 | Shiraishi | 355/55 |
| 5,636,004 A | * | 6/1997 | Ootaka et al. | 355/67 |
| 5,742,376 A | * | 4/1998 | Makinouchi | 355/53 |
| 6,218,077 B1 | * | 4/2001 | Jin | 430/311 |
| 2002/0048288 A1 | * | 4/2002 | Kroyan et al. | 372/20 |

OTHER PUBLICATIONS

Lalovic, I., et al. "Depth of focus enhancement by wavelength modulation: Can we relax and improve focus latitude?", Proceedings of the 40th Interface Symposium Conference, 2003.
Fukuda H., et al. "Improvement of defocus tolerance in a halfmicron optical lithography by the focus latitude enhancement exposure method: Simulation and experiment", J. Vac. Sci. Technology B7 (4), Jul./Aug. 1989, pp. 667-674.
GrÅupner, et al, "Solutions for printing sub 100 nm contacts with ArF", Optical Microlithography XV, Proceedings of SPI, vol. 4691, pp. 503-514 (2002).
Schenker R., et al. "Alternating Phase Shift Masks for Contact Patterning", Optical Microlithography XVI, Proceedings of SPIE vol. 5040 (2003), pp. 294-302.
Schellenberg F. et al, "Optimization of real phase mask performance", 11th Annual BACUS Symposium on Photomask Technology, SPIE vol. 1604 (1991), pp. 274-296.

* cited by examiner

*Primary Examiner*—Diane I. Lee
*Assistant Examiner*—Chia-how Michael Liu
(74) *Attorney, Agent, or Firm*—Edell, Shapiro & Finnan, LLC

(57) ABSTRACT

A method of focus variation is described herein to achieve a one-step exposure of a wafer without the limitation of applying a complex y-tilt to a wafer stage. The position of the wafer surface to be exposed is periodically varied with respect to the focal plane, or vice versa. This relative movement between the focal plane, or best focus position along the optical axis and the wafer stage, or the wafer surface, is achieved by applying a movement to at least one of the reticle stage, one or more of the optical elements of the projection lens, and the wafer stage. The frequency of the movement is selected in dependence of the laser frequency (upper limit) or the scanning frequency (lower limit).

15 Claims, 6 Drawing Sheets scan direction

METHOD FOR EXPOSING A SEMICONDUCTOR WAFER BY APPLYING PERIODIC MOVEMENT TO A COMPONENT

FIELD OF THE INVENTION

The invention relates to a method for exposing a semiconductor wafer with a pattern from a reticle or mask in an exposure tool. The invention particularly relates to exposing semiconductor wafers using a focus variation method in order to improve the process window of a lithographic projection step.

BACKGROUND

In fabricating integrated circuits, multiple patterns are projected, by means of exposure, each one by one from a mask or reticle into resist layers formed on a semiconductor wafer. Each of the exposures is usually followed by steps of processing the layer, which may relate to baking and developing the resist layer, etching the pattern formed in the resist further into an underlying layer, removing the resist, etc. such that a number of levels of the integrated circuit are sequentially formed.

With continuously increasing densities of structures within patterns, the resolution capability of exposure tools has been reached, which happens when structure widths become comparable to the wavelength of an exposure light beam, which is used to project the pattern onto the wafer. Accordingly, resolution enhancement techniques have been developed to push the dimensional limits in forming structures to even smaller structure widths, or pitches of periodic patterns. These techniques relate, for example, to the use of half-tone or alternating phase shift masks in an exposure, or to apply optical proximity corrections to the mask layout.

Critical patterns to be transferred from a mask to a semiconductor wafer are, e.g., contact hole patterns. Contact holes are generally formed to connect different layers of an integrated circuit and may include periodically arranged square-like openings, e.g., as in the case of dynamic random access memories (DRAM), where the contact holes have a particularly critical width with respect to the resolution limit of a respective exposure tool.

In comparison with line and space patterns, e.g., contact hole patterns are less suited for the alternating phase shift mask technique, although it has been shown in Schenker et al. "*Alternating Phase Shift Masks for Contact Patterning*" in: *Optical Microlithography XVI, Proceedings of SPIE, vol.* 5040 (2003) that an improvement with respect to conventional mask lithography may be accomplished. According to an analysis described in Schenker et al., additional constraints are placed on a lithographic projection step when tight pitches (i.e., large structure densities) have to be manufactured. These constraints particularly relate to accurate phase control, defect inspection and specific repair requirements.

Thus, the application of specific mask types, such as phase shift masks, or the application of specific features within the pattern, such as assist features, leads to considerable limitations particularly with respect to depth of focus (DoF), etc. Further, the application of specific mask types necessitates an extraordinarily high precision with regard to an etch process performed on a corresponding mask substrate.

In order to improve the process window when lithographically projecting contact hole patterns onto wafers, the use of so-called Bessel contacts has been proposed in Schellenberg et al., "*Optimization of Real Phase Mask Performance*", 11th *Annual BACUS Symposium on Photomask Technology, SPIE vol.* 1604 (1991), page 274-296. According to that option, contact hole openings on the mask are provided with thin rim-like phase edges adjacent to the boundary of such openings. However, this option has only very limited application ranges and is further difficult to realize in mask manufacturing processes.

Another approach to improve process windows relates to pupil filtering, as described in Gräupner et al., "*Solutions for Printing Sub* 100 *nm Contacts with ArF*", *Optical Microlithography XV Proceedings of SPIE Vol.* 4691, pp. 503-514 (2002). Therein, the formation of tri-tone contacts is suggested in the case only of large pitches (p>400 nm), while the application of pupil filtering, especially transmission filtering, within the pupil plane of the projection lens is not considered to improve the process window. Concurrently, the machine complexity and wafer throughput increases therefrom. As a consequence the approach of pupil filtering is also of limited use with respect to transferring contact hole patterns.

Another approach relates to focus drilling. A lithographic step is divided into a number of exposure steps, each step being performed with another focus offset of the wafer with respect to a focal plane of the projection lens. This method is also called "focus latitude enhancement exposure" (FLEX) and is disclosed, e.g., in Fukuda, H, et al. "*Improvement of defocus Tolerance in a Half-Micron Optical Lithography by the Focus Latitude Enhancement Exposure Method. Simulation and Experiment*", *J. Vac. Sci. Technol. B*.7 (4) July/August 1989, P. 667-674. As is pointed out in Fukuda et al., the drilling or variation of focus is particularly promising with respect to contact holes. However, a problem arises with respect to the realization as a single exposure (throughput issues) and further the control of that exposure (loss of focus accuracy due to repeated auto focus adjustment for each exposure).

In literature, it has further been proposed to apply a y-tilt to the wafer stage, which results in a through-the-focus exposure (see, e.g., Lalovic, E et al. "*Depth of Focus Enhancement by Wavelength Modulation: Can We RELAX and Improve Focus Latitude?*", *Proceedings of* 40th *Interface Symposium Conference* 2003), when the movement of a scanning in y-direction is adapted to the tilt. Disadvantageously, this proposal suffers from the limited dynamic leveling range of the exposure during scanning and a non-uniformity of the light intensity across the slit of a scanning apparatus. Further, the increase in depth of focus (DoF) is smaller than for, e.g., 2-3 exposures applied with a focus offset according to the FLEX-method.

It has further been suggested to mimic a focus offset by means of performing exposures with dual wavelengths of the laser instead of a single wavelength. The wavelength linearly scales with focus offset such that, instead of varying the height of the wafer stage, the laser of an exposure tool light source can be tuned to exhibit two wavelengths in one exposure, or a first wavelength in a first exposure and a second wavelength in a second exposure.

A prerequisite of this approach is that the projection optics reveal a chromatic aberration in length direction (CHL). However, disadvantages arise when pattern displacement and image deterioration occur over the scanner field by means of chromatic magnification that comes along with lens imperfections.

From the foregoing, it becomes clear that any known approach of driving sizes of structures in contact hole patterns nearer to the resolution limit suffers from one of: process window decrease, throughput reduction, severe constraints on mask manufacturing, constraints on exposure tool design, etc.

SUMMARY

It is an object of the present invention to increase the process window, particularly with respect to depth of focus (DoF) of a lithographic structuring step.

It is another object of the present invention to circumvent limitations on mask manufacturing and to increase the throughput when performing an exposure step.

It is a further object of the present invention to increase the quality of a lithographic projection step.

The aforesaid and other objects are achieved individually and/or in combination, and it is not intended that the present invention be construed as requiring two or more of the objects to be combined unless expressly required by the claims attached hereto.

In accordance with the present invention, a method for exposing a semiconductor wafer with a pattern from a reticle in an exposure tool, where the exposure tool includes a reticle stage, a projection lens system and a wafer stage, and the stages and the lens system are arranged along an optical axis, includes the steps of: providing the semiconductor wafer to the wafer stage and the reticle to the reticle stage of the exposure tool; applying a periodic movement having a frequency to the wafer along the optical axis such that a position of the semiconductor wafer with respect to a focal plane of the projection lens system is periodically varied; and directing a light beam from an illumination source of the exposure tool to the reticle and from the reticle through the projection lens system onto a portion of a surface of the semiconductor wafer while the periodic movement is applied to the wafer.

In another embodiment of the present invention, a method for exposing a semiconductor wafer with a pattern from a reticle in an exposure tool, where the exposure tool includes a reticle stage, a projection lens system and a wafer stage, and the stages and the lens system are arranged along an optical axis, includes the steps of: providing the semiconductor wafer to the wafer stage and the reticle to the reticle stage of the exposure tool; applying a periodic movement having a frequency to the reticle along the optical axis such that a focal plane of the projection lens system is periodically varied with respect to the semiconductor wafer; directing a light beam from an illumination source of the exposure tool to the reticle and from the reticle further through the projection lens system onto a portion of a surface of the semiconductor wafer while the periodic movement is applied to the reticle.

In a further embodiment of the present invention, a method for exposing a semiconductor wafer with a pattern from a reticle in an exposure tool, where the exposure tool includes a reticle stage, a projection lens system and a wafer stage, and the stages and the lens system are arranged along an optical axis, includes the steps of: providing the semiconductor wafer to the wafer stage and the reticle to the reticle stage of the exposure tool; applying a periodic movement having a frequency to at least one optical element of the projection lens along the optical axis such that a position of the focal plane of the projection lens system is periodically varied with respect to the semiconductor wafer; directing a light beam from an illumination source of the exposure tool to the reticle and from the reticle further through the projection lens system onto a portion of a surface of the semiconductor wafer while the periodic movement is applied to the at least one lens element.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
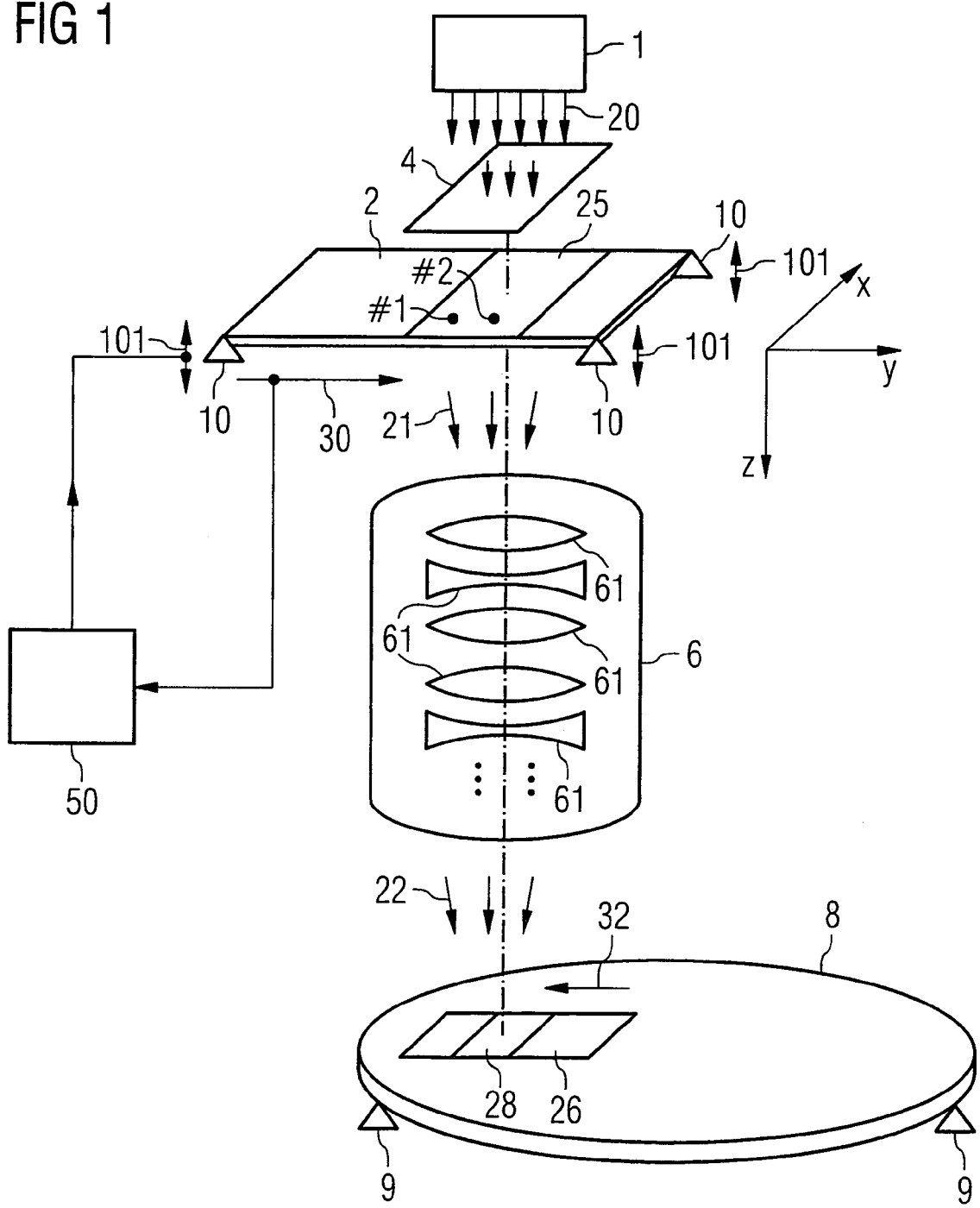
FIG. 1 depicts an exposure tool for conducting a method according to the present invention, where a reticle on a stage is periodically moved.

The present invention provides a method of focus drilling, or focus variation, which accomplishes a one-step exposure of a wafer without the limitation of applying a complex tilt to a wafer stage. Rather, the position of the wafer surface to be exposed is varied with respect to the focal plane, or vice versa. This relative movement between the focal plane and the wafer stage, or equivalently the wafer surface which may include a photosensitive resist, can be realized according to various embodiments of the invention, which have a similar effect.

A first feature of the invention relates to the movement of the wafer parallel to the optical axis of the projection system while the focal plane is held fixed. During this movement, the surface of the wafer and the focal plane are substantially parallel with respect to each other. The movement may, e.g., be effected via the wafer stage.

The term "optical axis", as used herein, is not restricted to straight axes, but also to axes that are deflected, e.g., by reflection devices such as mirrors. As is clearly recognized by a person skilled in the art, the term "optical axis" also includes various geometric configurations defined by the specific arrangement of reflective or refractive elements of an optical system. Accordingly, when an optical axis is described in an embodiment herein as a straight line, this should not be understood as a restriction of the invention to exposure tool projection apparatuses that lack any kind of reflective elements.

According to a second feature of the invention, the wafer is held fixed, but the reticle is moved along the optical axis during the exposure. As a result, the focal plane is shifted along the optical axis in response to the reticle variation, and thus, the focus offset of the wafer surface with respect to the focal plane varies equivalently. The movement may be effected via the reticle stage.

According to a third feature of the invention, optical elements of the projection lens are varied along the optical axis, which also leads to a shift of the focal plane with respect to the wafer stage as described below.

In each case, no significant tilt is applied to the wafer in order to achieve a through-the-focus exposure, i.e., within one exposure step—with the possible exception that an aberration of the lens system is to be corrected or a previous auto focusing step necessitates a comparatively small amount of tilt.

The movement parallel to the optical axis is periodic. This means that the focus offset according to each of the embodiments varies between a minimum and a maximum value of absolute focus periodically with respect to time, tuned to the frequency of the laser and/or the scan speed, which can vary during exposure. Preferably, the movement is symmetric about a mid-focus, which is in an ideal case chosen to be the best focus.

According to an embodiment of the invention, which relates to each of the three features as described above, the periodic movement has a frequency, which is adapted to the frequency of the illumination source of the exposure tool. For example, the source may be a laser. The laser emits a light beam for transferring the pattern from the reticle to the semiconductor wafer that comprises pulses. These laser pulses have a short duration and are interrupted by a time gap, which typically lasts for a multiple of the pulse durations.

In this embodiment, the movement of the stages (mask or reticle, wafer) or of the optical elements may be performed, within such a time gap and a fixed amount of energy is passed in time until the stage, or the optical element, moves back to its previous or another position on the optical axis according to its periodic movement. If that position is changed between each of the pulses, the frequency of the periodic movement of the stages or the optical elements amounts to half of that of laser pulse frequency. Generally, within each period the energy of n pulses are collected in an upper and lower focus position. Then the frequency of movements is $f_{movement}=f_{laser}/(2*n)$. The movement can be continuous, and the energy is exposed at a variety of focus positions.

According to another embodiment of the invention also relating to each of the three features described above, the periodic movement is chosen to depend on the scanning speed of a slit, when the exposure tool is a scanning apparatus. This and the previous embodiment become particularly advantageous with scanning apparatus, because in both embodiments it is guaranteed that each portion of the surface of the wafer has experienced the same dose with respect to focus offset. The scanning speed divided by the effective depth of the slit of the scanning apparatus therein sets a lower limit to the frequency of the periodic movement along the optical axis, while the half of the laser frequency sets a reasonable upper limit. Higher limits are nevertheless possible, with $f=f_{laser}*(m+\frac{1}{2})$, where m is an integer. The effective slit depth is defined by a rectangular (top hat) intensity distribution in the slit that is equivalent to the real distribution with respect to the energy versus defocus dependence.

It can be shown that every even intensity distribution (mirror symmetric with respect to the middle of the field along scan direction for every point in field perpendicular to scan direction) is equivalent to rectangular intensity distribution with an effective depth of scan field, e.g., a symmetric trapezoidal intensity distribution is equivalent to a rectangular one with a width comprised of the average of upper and lower width of the trapezoid.

The invention is not limited to the particular examples as provided herein. One skilled in the art will readily recognize that the embodiments described herein, illustrating the application of a periodic movement to optical components in an exposure tool during exposure, can be easily applied to equivalent configurations designed to perform a lithographic step. For example, exposure tools that make use of reflection type masks are explicitly included within the scope of this invention.

FIG. 1 shows a first embodiment relating to the second feature as described above in accordance with the present invention. An exposure tool has an illumination source 1, a slit 4, a projection lens 6, a reticle stage 10 and a wafer stage 9. Both stages 9, 10 are schematically sketched as a set of triangles in the drawings. It will be clear to one skilled in the art that a wafer stage typically includes a plate being moved by a motor and further including components such as fine adjustment tools, etc. Similar features are also included for the reticle stage.

Figure 2:
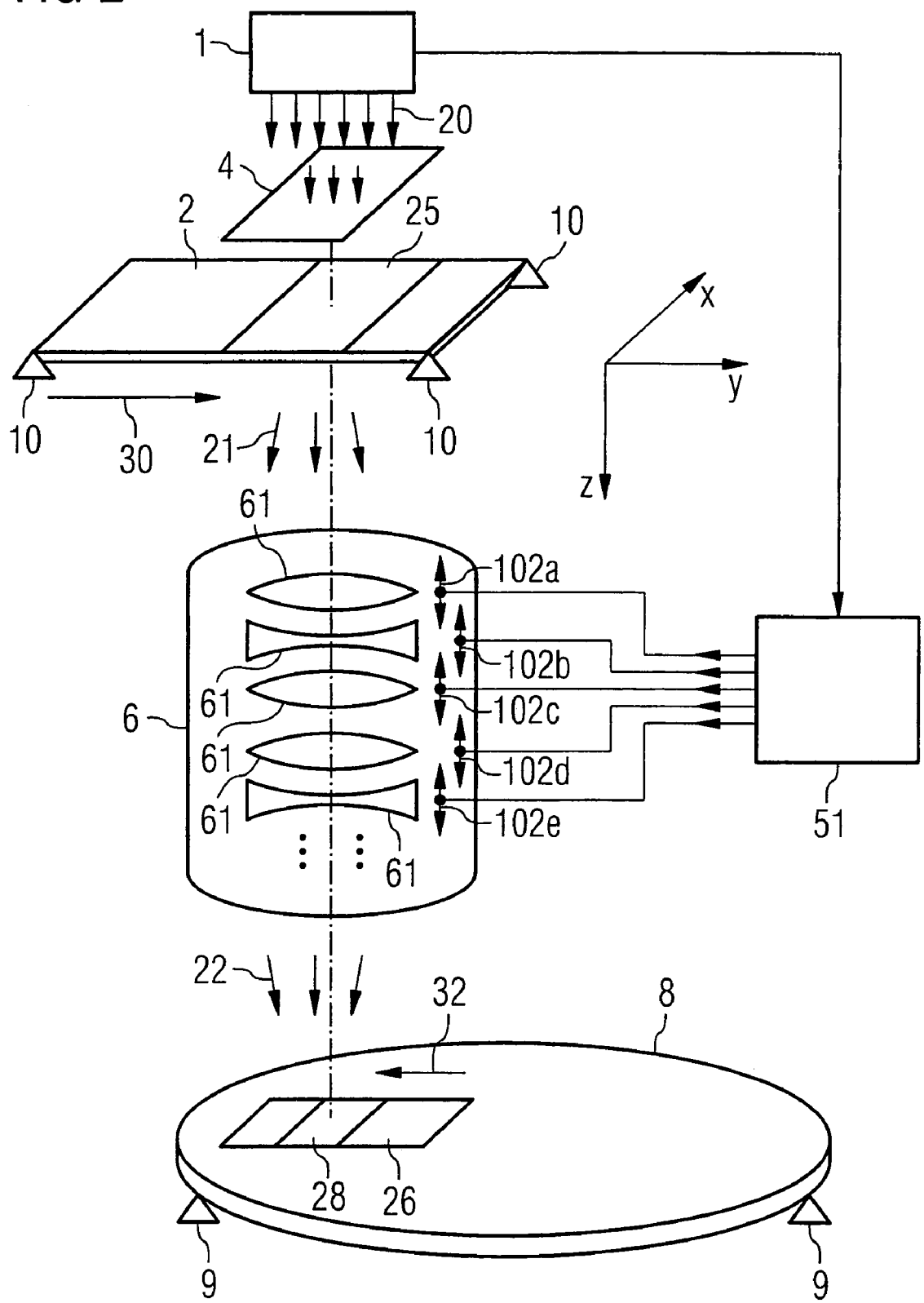
FIG. 2 depicts an exposure tool for conducting another method according to the present invention, where a number of optical elements on a stage are periodically moved.
Figure 3:
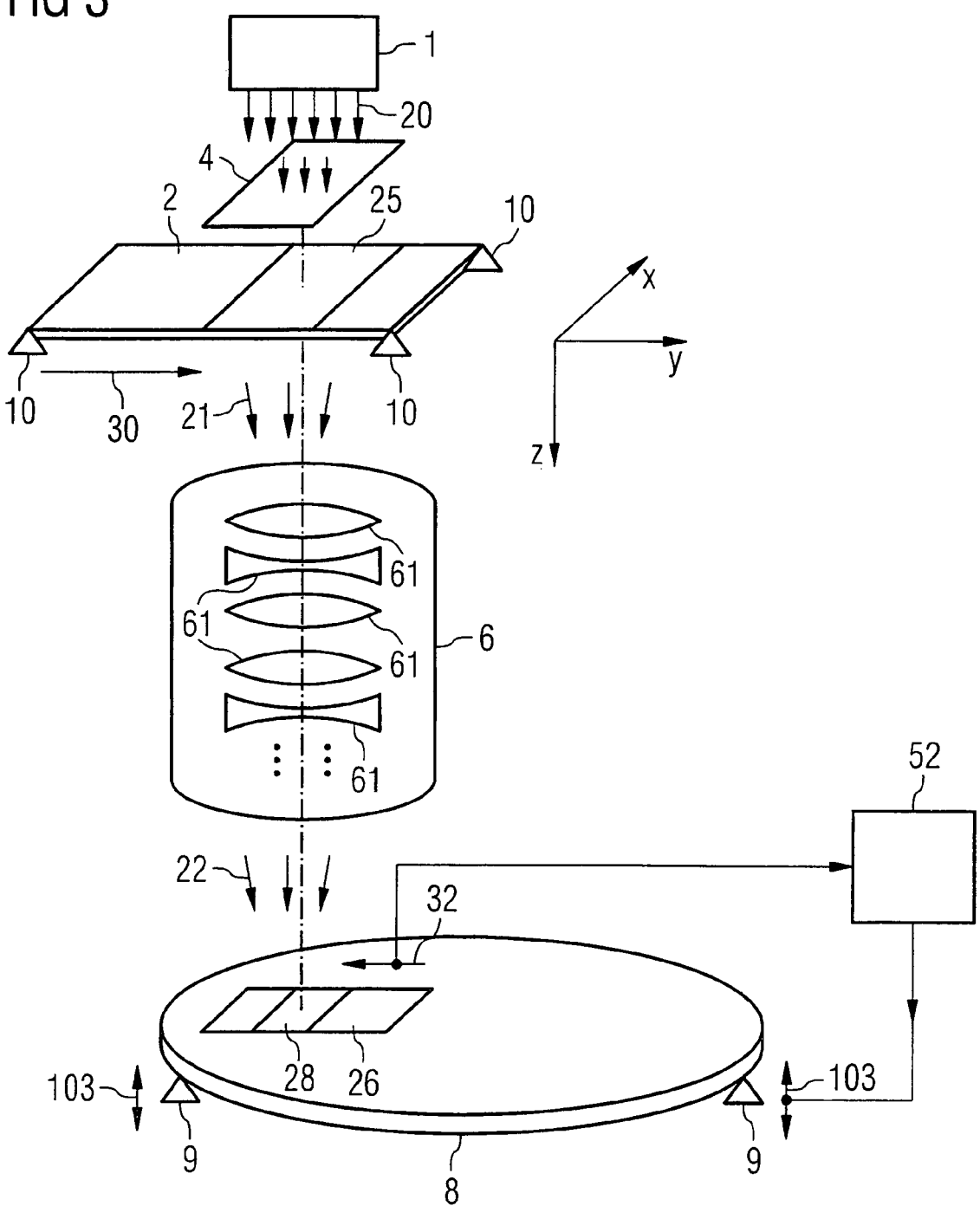
FIG. 3 depicts an exposure tool for conducting a further method according to the present invention, where a wafer on a stage is periodically moved.

As indicated by arrow 30, reticle 2, which includes a pattern not shown in FIG. 1, is moved in a direction perpendicular to the optical axis (indicated by the dashed line in each of FIGS. 1-3). Due to that movement, an area 25 that is exposed with light beam 20 through slit 4 moves across the surface of the reticle 2. A movement indicated by arrow 32 of the wafer stage 9, which is coordinated with the reticle stage movement 30 according to the magnification factor of typically ¼ of the projection lens 6, is performed perpendicular to optical axis at wafer level. A surface portion 28 on the wafer is thereby exposed with the pattern of the reticle by imaging through the projection lens 6.

Having performed a scan with respect to slit 4, the whole pattern is transferred from the reticle 2 to the wafer 8 which results in an exposed image field 26. The movements 30, 32 are accomplished by means of the reticle 10 and the wafer stage 9, respectively. The projection lens includes a number of movable lens or mirror elements 61, which can amount up to ten or more in number.

The light beam 20 emitted by the illumination source 1 undergoes diffraction by the pattern of reticle 2 to yield a widened light beam 21, which is then focused as light beam 22 to a focal plane by the projection lens 6. The focal plane, which is not shown in FIG. 1, varies in height with respect to the direction of the optical axis between positions above and below the surface of wafer 8 as explained below.

According to this embodiment, a periodic movement indicated by arrows 101 is applied to the reticle including the pattern and in a direction along the optical axis of the exposure tool. When the exposure tool is a double telecentric system, as is the case in FIG. 1, the variation of the height of reticle 2 results in a shift of the best focus, or the focal plane, by an amount that corresponds in Seidel theory to the shift divided by the square of the inverted magnification (1/16 if the demagnification is 4.0). For example, a shift of 1 μm of the reticle 2 along the optical axis leads to a focus variation of 62.5 nm with respect to the wafer 8 held fixed.

For the purpose of setting the frequency, with which the movement is achieved, the scanning speed of the reticle stage is obtained. This may be accomplished, e.g., from a given setup of the current exposure, by means of a control unit 50. Control unit 50 may be, but is not limited to, a workstation that controls operation of the exposure tool.

Figure 7A:
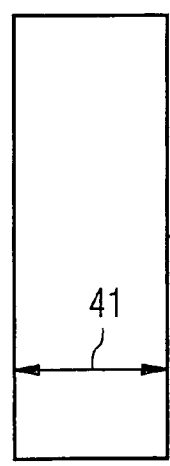
FIGS. 7A and 7B depict slit geometries with potential scanning fields, fulfilling the requirement for constant effective depth of scanning field perpendicular to scan direction.
Figure 7B:
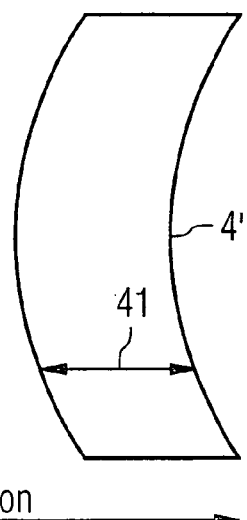

The control unit 50 determines the frequency of the periodic movement 101 from the scanning speed and from the effective depth of slit 4. This includes various geometries of slits other than, e.g., rectangular, if the effective depth of the slit does not vary significantly perpendicular to the scan direction. An example of possible slit geometries departing from purely rectangular is shown in FIGS. 7A and 7B. In FIG. 7B, a modified slit 4' is shown having a rounded shape, which has the same slit depth 41 as that slit 4 of FIG. 7A having the rectangular form. If the effective slit depth may be variably set, the current value may as well be obtained from a system setup configuration file. Dividing the scanning speed by the effective slit depth gives a frequency that provides a lower limit to the frequency of the periodic movement 101.

Figure 5:
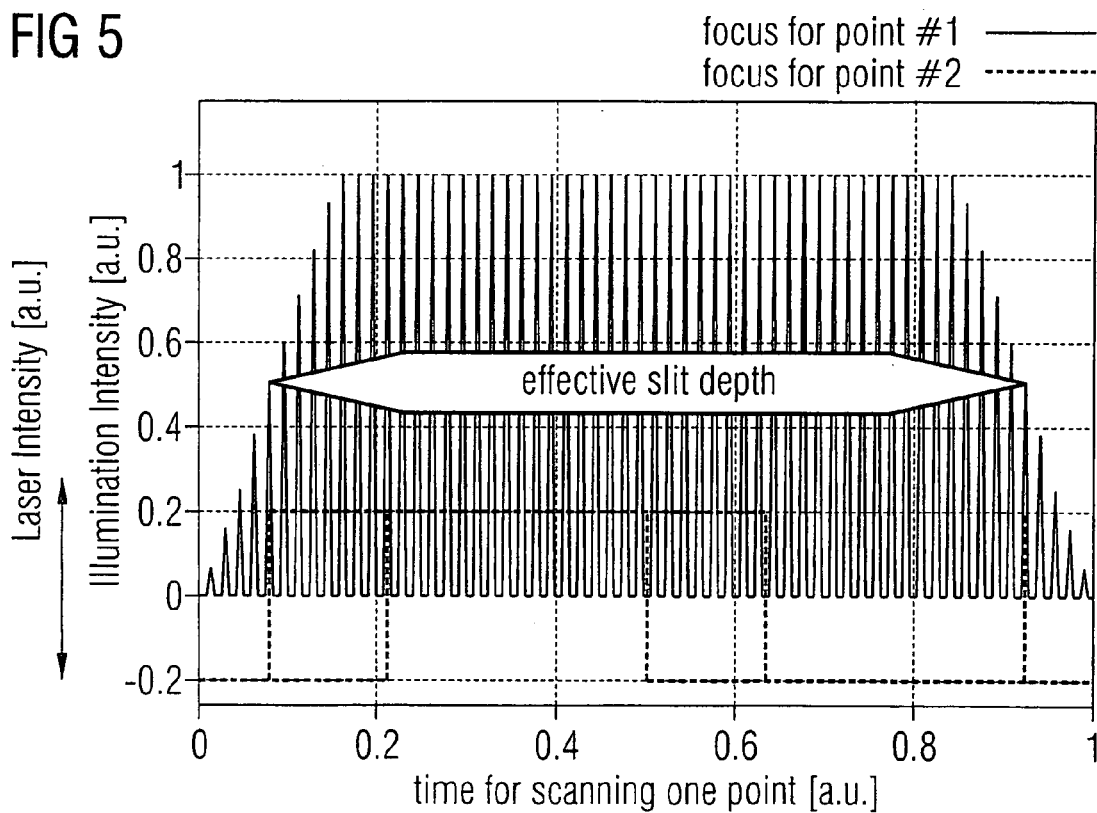

In a preferred embodiment, the maximum and minimum values of focus are symmetric about a best focus position. Examples of the periodic movement 101 of the reticle stage 10 are provided in FIGS. 5 and 6, respectively, which illustrate the case wherein the frequency is selected in accordance with the scanning speed of slit 4. FIG. 5 shows the case of a rectangular movement. Dashed lines reveal the evolution of the focus offset for two specific points #1 and #2, which are arranged within the pattern on the reticle. Also illustrated in the diagram is the evolution of the laser intensity versus time. A sequence of laser pulses can be seen, which increases with time, when the slit starts to expose the specific points #1 or #2, respectively, and finally ends, when the slit has passed these points #1 or #2, respectively.

The sequence of pulses being experienced by both points #1 and #2 is overplotted in FIG. 5 (i.e. shifted along the time axis). Accordingly, the periodic movement 101 of both points does not coincide in this diagram due to their offset in scan direction with respect to each other (see FIG. 1).

In this embodiment, the duration of one period of the movement 101 is chosen to be equivalent to the scanning speed of slit 4 divided by the effective slit depth, which is clearly visible from FIG. 5. Due to this construction, each of the points #1 or #2 or any other point on the reticle 2 experiences the same amount of time at a focus offset of +0.2 as well as −0.2 in arbitrary units during the relevant time for exposure.

Figure 6:
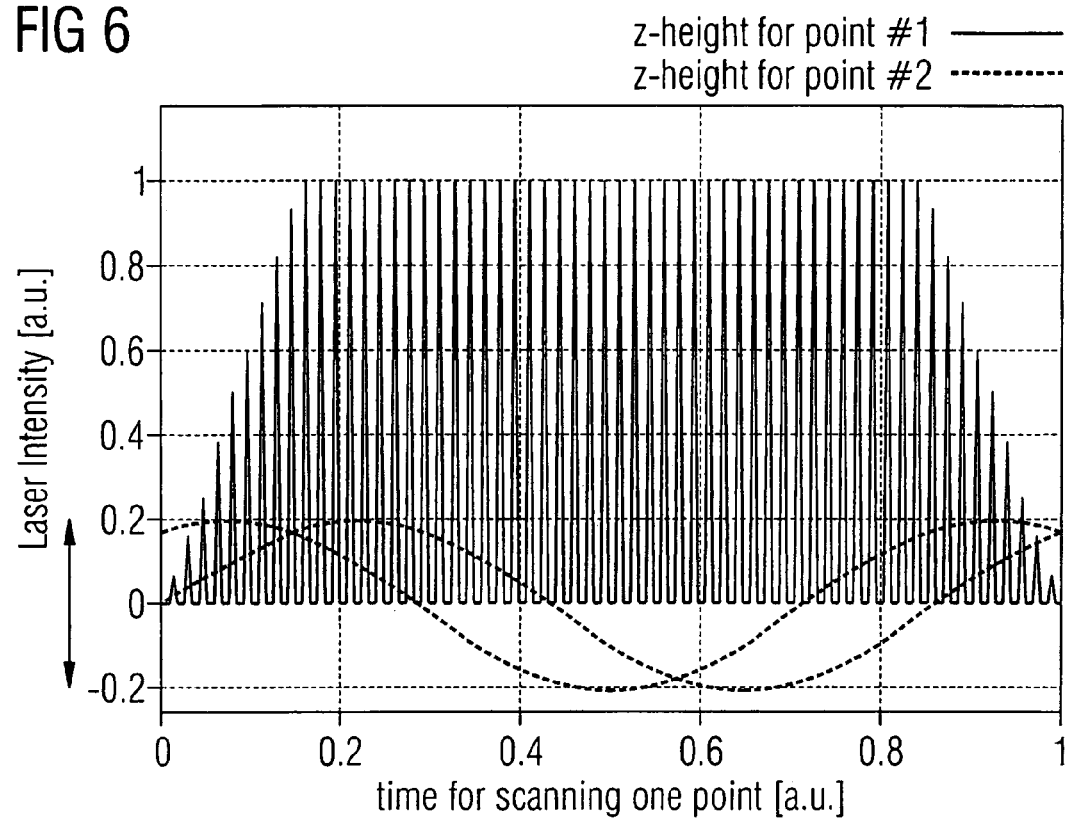

FIG. 6 shows a similar embodiment, with the exception that a sinusoidal periodic movement 101 has been realized. This embodiment has a particular advantage in that the amount of acceleration of the reticle stage, or any other optical component (such as optical elements of the projection lens system 6 or the wafer stage 9 according to further aspects of the invention) is decreased during the periodic movement, in contrast to the sudden jump movement corresponding to the rectangular curve in FIG. 5.

Figure 8A:
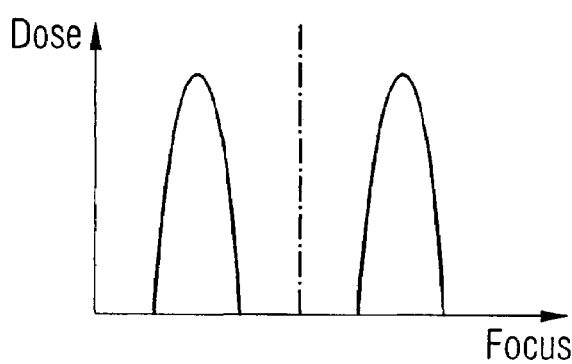
FIGS. 8A and 8B are diagrams depicting examples for the requirement for mirror symmetric dose distribution with respect to focus.
Figure 8B:
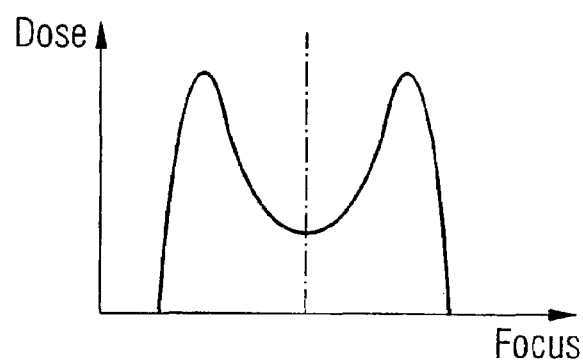

For example, the control unit 50 obtains a scanning speed of 500 mm/s for the present setup as well as an effective slit depth of 10 mm. It calculates a "scanning frequency" of 50 Hz therefrom and applies exactly this frequency to the periodic movement of the reticle stage 10. In another example, whole-numbered multiples of the "scanning frequency" are used in order to fulfill a requirement that each point within the pattern on the reticle experiences the same exposure dose in a position with a positive and with a negative focus offset. If such a requirement is violated, different field points would experience different exposure doses at systematically different focus, which depends on position within the pattern, or image field 28. The plots of dose versus focus of all field points must be within acceptable limit, e.g., 5%. On the other hand, this requirement for exposure dose uniformity might be also fulfilled for not precise periodic pulses, energy variations from pulse to pulse and/or scan speed variation from field to field or within a field. FIGS. 8A and 8B show diagrams of example distributions of dose versus focus.

As can be seen from FIGS. 5 and 6, the laser intensity represents a sequence of pulses. When an ArF-laser is used as an illumination source 1 having a frequency of typically about 4 kHz, 80 pulses fall within a period of the movement 101 of the reticle stage 10 (with 500 mm scan speed; 10 mm slit width). Thus, if one up- or down-movement of the stage 10 occurs just when a pulse is emitted, the effect in dose amounts to only 1.3%, which can be acceptable.

A second embodiment is shown in FIG. 2 and relates to the third feature as described above and in accordance with the present invention. Similar reference numerals denote the same components in the drawings. According to this embodiment, optical elements 61 of the projection lens 6 are varied in their position along the optical axis in order to change the best focus or focal plane position.

An exposure tool having a common ArF-laser illumination source use can be made of 5 optical elements 61 moved coincidently with the reticle 2 along the optical axis (not shown in FIG. 2) in order to induce an image offset of 500 nm with respect to an initial best focus position. This can be achieved without getting image deteriorations due to lens aberrations, which amount to values larger than about 1 nm. Therein, at least one of the optical elements 61 is to be moved according to the present invention.

The variation of position along the optical axis of the optical elements 61 results in Seidel aberrations of lowest order, i.e., magnification, third order distortion, focus offset, field curvature coupled with astigmatism curvature, coma tilt and offset of spherical aberration. Preferably, 6 optical elements are shifted independently according to this embodiment in order to find a superposition of induced aberrations, which result in diminishing first order Seidel aberrations—and coincidently in the desired shift of the best focus or focal plane position.

Control unit 51, which controls the periodic movement indicated by arrows 102a-102e along the optical axis of the six optical elements 61 (sixth element not shown in FIG. 2) is thus arranged to solve a corresponding linear equation. Nevertheless, higher order aberration terms may be induced when the lens elements are shifted, thus limiting the allowed range of shifts. Generally, the six optical elements may or may not include the movement of the reticle along the optical axis, even if the reticle is not an optical element in the common manner, but the object image distance is changed, which translates in change of optical behavior.

The linear matrix equation to be solved is as follows:

$$\left| \sum_{i=1}^{n} \vec{S}^i \times V^i - \vec{F} \right|^2 \rightarrow \min,$$

wherein S is the vector of the sensitivity of each of the optical elements 61 with respect to shifts along the optical axis, V is the movement of the optical element 61, and F is the vector of allowed aberrations, ideally containing zeros for all aberration terms with the exception of focus shift.

Once a set of coordinated, but separate movements 102a-102e has been determined for the optical elements 61 of projection lens 6, a frequency has to be set. In this embodiment, the frequency of the periodic movements 102a-102e is selected in dependence of the frequency of the illumination source 1, which is, e.g., an ArF-laser having a frequency of 4 kHz. The frequency of the periodic movements 102a-102e is then calculated to amount to half of that value, i.e., 2 kHz. It is to be noted that each of the movements 102a-102e is to have the same frequency, while the movement may differ in direction and amount.

Figure 4:
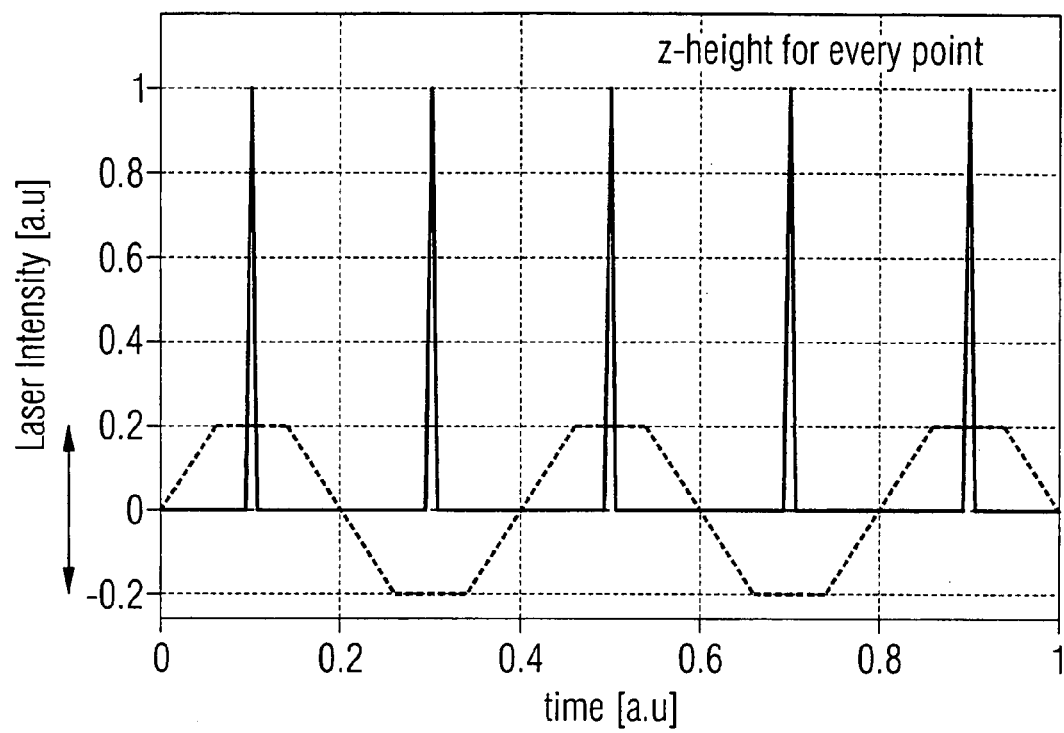
FIGS. 4-6 are diagrams depicting a comparison between the laser intensity and focus-offset evolution versus time for frequency settings for the periodic movement applied to the reticle or wafer via its stages or to the lens elements as shown in FIGS. 1-3.

As a result of this frequency selection, each pulse of the emitted laser beam 25 is associated with one specific focus value, as is illustrated in FIG. 4, where the dashed curve shows one of the period movements 102a-102e of one of the lens elements 61. One laser pulse lasts for, e.g., 10 to 30 ns. The time gap between two pulses lasts for, e.g., 250 µs.

A third embodiment is shown in FIG. 3, which relates to the first aspect as described above in accordance with the present invention. In this embodiment, a movement 103 along the optical axis is applied to the wafer stage 9. The movement 103 is controlled by a control unit 52. The control unit 52 obtains a frequency from the scanning speed divided by the effective slit depth, as in the embodiment of FIG. 1, and calculates therefrom a frequency for the periodic movement indicated by arrows 103 of the wafer 8.

The movement of the wafer stage may also be adapted to the frequency of the illumination source, a laser, which, for example, amounts to about 4 kHz. In order to accurately associate each pulse with a stable focus offset position, the frequency of the movement has to be one half, or a even-numbered divisor (½/n; n being a natural number) of the laser frequency.

In the previous examples, each of the features, which relate to different elements in the optical path to be moved for effecting a focus variation, may be combined with each frequency selection for the periodic movement, i.e., a coupling to the divisors of the laser frequency and/or to multiples of the "scanning frequency" (scanning speed divided by effective slit depth), or with each form of the movement, i.e., rectangular or continuously, sinusoidal or saw tooth, etc. Accordingly, possible combinations go far beyond what is illustrated in the embodiments presented in the figures.

The movement along the optical axis of wafer, reticle and/or optical elements can be achieved, e.g., by piezo elements or acoustic generators (actuators) and corresponding control electronics. Most practically, the mechanisms used to control tilt, focus and/or aberrations are used to generate the innovative movement along the optical axis as described in this invention.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A method for exposing a semiconductor wafer with a pattern from a reticle in an exposure tool, the exposure tool comprising a reticle stage, a projection lens system and a wafer stage, with the reticle and wafer stages and the lens system being arranged along an optical axis, the method comprising:

providing the semiconductor wafer to the wafer stage and the reticle to the reticle stage of the exposure tool;

applying a periodic movement having a frequency to the semiconductor wafer along the optical axis such that a position of the semiconductor wafer with respect to a focal plane of the projection lens system is periodically varied;

moving a plurality of optical elements of the projection lens system coincidentally and periodically with the frequency of the periodic movement of the semiconductor wafer, wherein the plurality of optical elements are also moved independently of each other in combination with being moved periodically to facilitate a determination of a superposition of induced aberrations in the projection lens system, and the plurality of optical elements are further moved coincidently with respect to each other to facilitate a shift in the focal plane to a desired position; and directing a light beam from an illumination source of the exposure tool to the reticle and further directing the light beam from the reticle through the projection lens system onto a portion of a surface of the semiconductor wafer while the periodic movement is applied to the wafer and while periodic and independent movement is applied to the optical elements.

2. The method of claim 1, wherein the illumination source is a laser that emits a sequence of pulses as the light beam, and the method further comprises:

determining a frequency of the sequence of pulses emitted as the light beam; and selecting the frequency of the periodic movement applied to the semiconductor wafer based upon the frequency of pulses.

3. The method of claim 2, wherein the frequency of the periodic movement is selected to be equal to the frequency of pulses divided by an even number.

4. The method of claim 3, wherein the even number is 2, such that the frequency of the periodic movement applied to the semiconductor wafer is equal to half of the frequency of the sequence of pulses.

5. The method of claim 2, wherein the frequency of the periodic movement is selected to be less than or equal to 10 kHz.

6. The method of claim 1, wherein the exposure tool is a wafer scanning apparatus comprising a slit that moves with a scanning speed relative to the surface of the reticle during an exposure, and the method further comprises:

determining the scanning speed and an effective depth of the scanning slit; and determining a frequency of the scanning slit by dividing the scanning speed by the effective depth of the scanning slit;

selecting a multiple of the frequency of the periodic movement applied to the semiconductor wafer based upon the frequency of the scanning slit.

7. The method of claim 6, wherein the frequency of the periodic movement is at least 1 Hz.

8. The method of claim 6, wherein the periodic movement is described by a rectangular curve defining a position of the wafer along the optical axis versus time.

9. The method of claim 6, wherein the periodic movement is described by a sinusoidal curve defining a position of the wafer along the optical axis versus time.

10. The method of claim 6, wherein the periodic movement is described by a sawtooth shaped curve defining a position of the wafer along the optical axis versus time.

11. The method of claim 1, wherein the illumination source is a laser that emits a sequence of pulses as the light beam, and the method further comprises:

determining a frequency of the sequence of pulses emitted as the light beam; and selecting the frequency of the periodic movement based upon the frequency of pulses.

12. The method of claim 11, wherein the frequency of the periodic movement is selected to be equal to the frequency of pulses divided by an even number.

13. The method of claim 12, wherein the even number is 2, such that the frequency of the periodic movement is equal to half of the frequency of the sequence of pulses.

14. The method of claim 11, wherein the frequency of the periodic movement is selected to be less than or equal to 10 kHz.

15. The method of claim 1, wherein movement of the plurality of optical elements independently of each other reduces aberrations in the projection lens system.

* * * * *